(12) United States Patent
Gordon et al.

(10) Patent No.: US 6,573,514 B2
(45) Date of Patent: Jun. 3, 2003

(54) METHOD FOR ALIGNING ELECTRON BEAM PROJECTION LITHOGRAPHY TOOL

(75) Inventors: Michael S. Gordon, Lincolndale, NY (US); Jon E. Lieberman, Hopewell Junction, NY (US); Christopher F. Robinson, Hyde Park, NY (US)

(73) Assignee: Nikon Corporation, Tokyo (JP)

( * ) Notice: Subject to any disclaimer, the term of this patent is extended or adjusted under 35 U.S.C. 154(b) by 127 days.

(21) Appl. No.: 09/864,244

(22) Filed: May 25, 2001

(65) Prior Publication Data

US 2002/0175295 A1 Nov. 28, 2002

(51) Int. Cl.⁷ ................................................ H01J 37/00
(52) U.S. Cl. ................ 250/491.1; 250/492.22
(58) Field of Search .......................... 250/491.1, 492.2, 250/492.22, 398

(56) References Cited

U.S. PATENT DOCUMENTS 4,393,312 A * 7/1983 Collier et al. ............ 250/492.2

* cited by examiner

Primary Examiner—Kiet T. Nguyen
(74) Attorney, Agent, or Firm—Whitham, Curtis & Christofferson, P.C.

(57) ABSTRACT

A method of aligning elements of an electron beam beam tool such as an electron beam projection lithography tool utilizes a detector such as a pinhole and scintillator over which an image is rastered to provide a real-time display of a projected image at a target plane. A shaping aperture is projected and the detector centered thereon. A reticle sub-field image is then centered on and aligned with the image of the shaping aperture and the compound image thus formed is rotated using deflectors. The compound image is then aligned with movement of a translation device at the target plane using lenses and compound image orientation is corrected by electrical or mechanical rotation of the deflectors. Sub-field size can then be adjusted and any observed further rotation of the compound image may be corrected by reiteration of rotation adjustment with lenses and deflectors, in sequence.

11 Claims, 9 Drawing Sheets

IMAGE OF SHAPING APERTURE PRIOR TO ALIGNING PINHOLE

IMAGE OF SHAPING APERTURE AFTER ALIGNING PINHOLE

METHOD FOR ALIGNING ELECTRON BEAM PROJECTION LITHOGRAPHY TOOL

BACKGROUND OF THE INVENTION

1. Field of the Invention

The present invention generally relates to electron beam projection lithography exposure tools and, more particularly, methods for aligning elements forming the electron beam projection column of such tools.

2. Description of the Prior Art

Demands for improved performance and increased manufacturing economy of semiconductor integrated circuits have driven minimum feature size regimes of integrated circuit designs to a small fraction of a micron. Such minimum feature sizes now being developed are beyond the resolution capability of lithographic exposure tools using deep ultraviolet (UV) wavelengths. Therefore, lithographic exposure with electron beams is now being developed and so-called probe-forming electron beam exposure tools have been in use for several years. However, probe-forming tools are only capable of exposing a single spot of perhaps as many as a few dozen or, at most, a few hundred pixels at a time. Modern integrated circuit designs, however, may include billions of pixels and sufficient throughput is not available from probe-forming tools to meet mass-manufacturing requirements even when individual exposures can be made at extremely high repetition rates.

Accordingly, electron beam projection lithography tools which feature patterning an electron beam with a reticle containing the pattern of a sub-field of an integrated circuit design and projecting the pattern on a target, usually with a demagnification of about 4:1 are being developed. However, the sub-field patterns must be projected with minimal distortion or aberration and must be positioned with an accuracy of only a small fraction of the minimum feature size design rules of the pattern to prevent, for example, narrowing of conductors which cross sub-field boundaries due to skewed positioning of sub-fields.

Electron beam projection lithography tools have numerous electron-optical elements in order to maintain aberrations at a very low level and to minimize aberrations while deflecting the electron beam as needed. Since the like charges of electrons in the beam cause mutual repulsion Coulomb effects, the electron beam column must generally be kept as short as possible. Therefore, the various electron-optical elements are often in such proximity that interactions occur. Each element may also have several distinct effects on the electron beam. For example, a focussing coil may cause beam rotation.

Aberrations usually increase with deflection and, for that reason, a translation stage is generally provided to assist the deflection in addressing all target locations. Similarly, to position respective reticle sub-fields to shape the beam, deflection elements and a translation stage are generally provided to move the reticle.

Additionally, the reticle must be sufficiently robust mechanically to withstand both accelerations necessary for rapid positioning and to avoid distortion and damage from thermal cycling due to electron energy absorbed when a portion of the beam is intercepted by the reticle pattern. Therefore, reticles are generally fabricated with relatively thick ribs running between patterned sub-fields formed by a much thinner membrane. The image of the shaping aperture at the reticle is adjusted in size to be slightly larger than the reticle sub-field to avoid hitting the ribs which could cause reticle heating and sub-field distortion.

Clearly, to achieve positional accuracy of a small fraction of the minimum feature size, many elements of diverse types must be exactly aligned and function together correctly. However, the variety of effects each element may have, the number of degrees of freedom for each element (e.g. axial position, axial rotation, axial alignment and the like) and the number of elements provided in an electron beam projection lithography tool (e.g. apertures, reticle, translation stages, deflectors, stigmators, focussing and collimating lenses and the like) have not allowed the development of a systematic methodology of tool element alignment which allows correct alignment to be achieved without a substantial number of iterations.

Additionally, there is no standardized configuration or order of elements in the electron beam column and when iterative adjustment is necessary, the element to be adjusted or the relative amount of adjustment to be made on two or more elements is not evident. That is, an artifact indicating a misalignment of one or more elements may not clearly indicate the element(s) which are misaligned. It is not even evident, when a particular adjustment is made, that other complementary adjustments will converge to a correct overall alignment of the elements of the tool.

SUMMARY OF THE INVENTION

It is therefore an object of the present invention to provide a systematic methodology for real time alignment of the reticle to the wafer in an electron beam projection lithography tool that avoids a need for writing of wafers.

It is another object of the invention to provide correct alignment of elements of an electron beam projection lithography tool, including sub-field magnification in a single iteration or very limited number of iterations.

In order to accomplish these and other objects of the invention, a method for aligning elements of an electron beam projection lithography tool is provided including centering and rotationally aligning an image of a shaping aperture with an image of a reticle sub-field to form a compound image, aligning orientation of the compound image with movement of a wafer stage of said electron beam projection lithography tool by lens adjustment, and correcting orientation and motion of the compound image relative to the movement of said wafer stage by rotational adjustment of a deflector. The above adjustments and adjustment of size and rotation can be performed in real-time by detecting a projected image at the target plane, preferably by scanning the image across a pin-hole and scintillator sensor and displaying a corresponding image.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
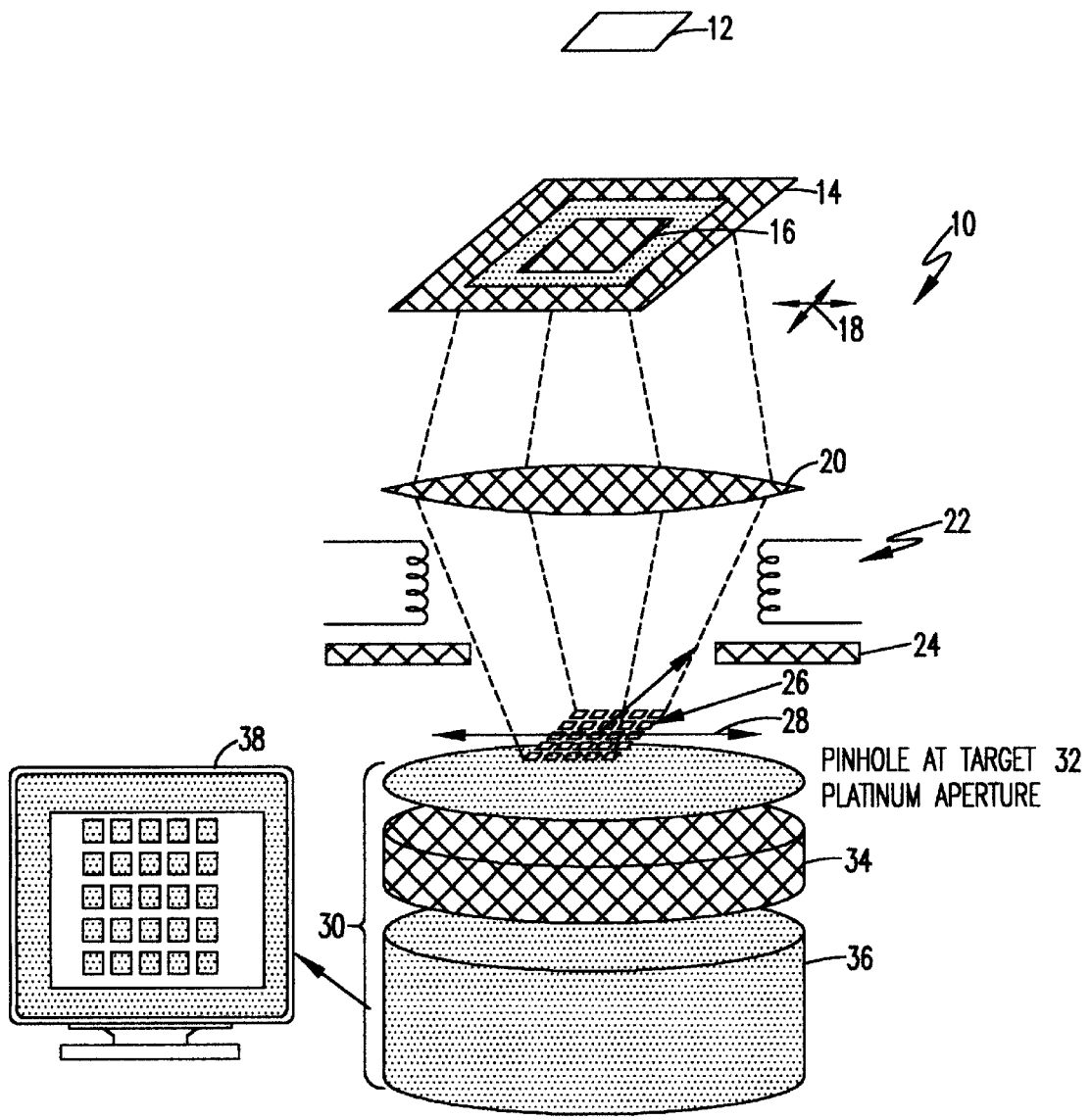
FIG. 1 is a schematic representation of a portion of an electron beam projection lithography tool including an alignment arrangement in accordance with the invention.

Referring now to the drawings, and more particularly to FIG. 1, there is shown a portion of the electron beam column of an exemplary and generalized electron beam projection lithography tool 10. A shaping aperture 12 is located below an electron beam source (not shown) and an image of the shaping aperture is focussed at the reticle plane 14 at which the patterned membrane of the reticle 16 can be located. As alluded to above, the reticle 16 can be translated in orthogonal directions by a positioning mechanism schematically indicated by arrows 18.

Various lenses collectively indicated at 20 are provided to demagnify, rotate and focus the image of a reticle sub-field onto the target plane, as schematically indicated at 26 using a contrast aperture 24. A translation mechanism, schematically indicated by arrows 28 is provided at the target plane.

In accordance with the invention, a detector 30 is also provided at the target plane. This detector includes a pin-hole 32 and a scintillator 34 located below the pin-hole 32. The pinhole 32 is generally formed to have an extremely small diameter or transverse dimension by electron discharge machining, lithographic processes or the like in a sheet or layer of a conductive material such as graphite, platinum or the like. The scintillator may be comprised of a layer of material which produces light upon being struck by an electron. A photomultiplier 36 detects the light produced and outputs an electrical signal which is variable with the intensity of light detected. The signal from photomultiplier 36 can then be processed as desired and displayed on monitor 38, preferably with intensity represented by color.

Figure 2:
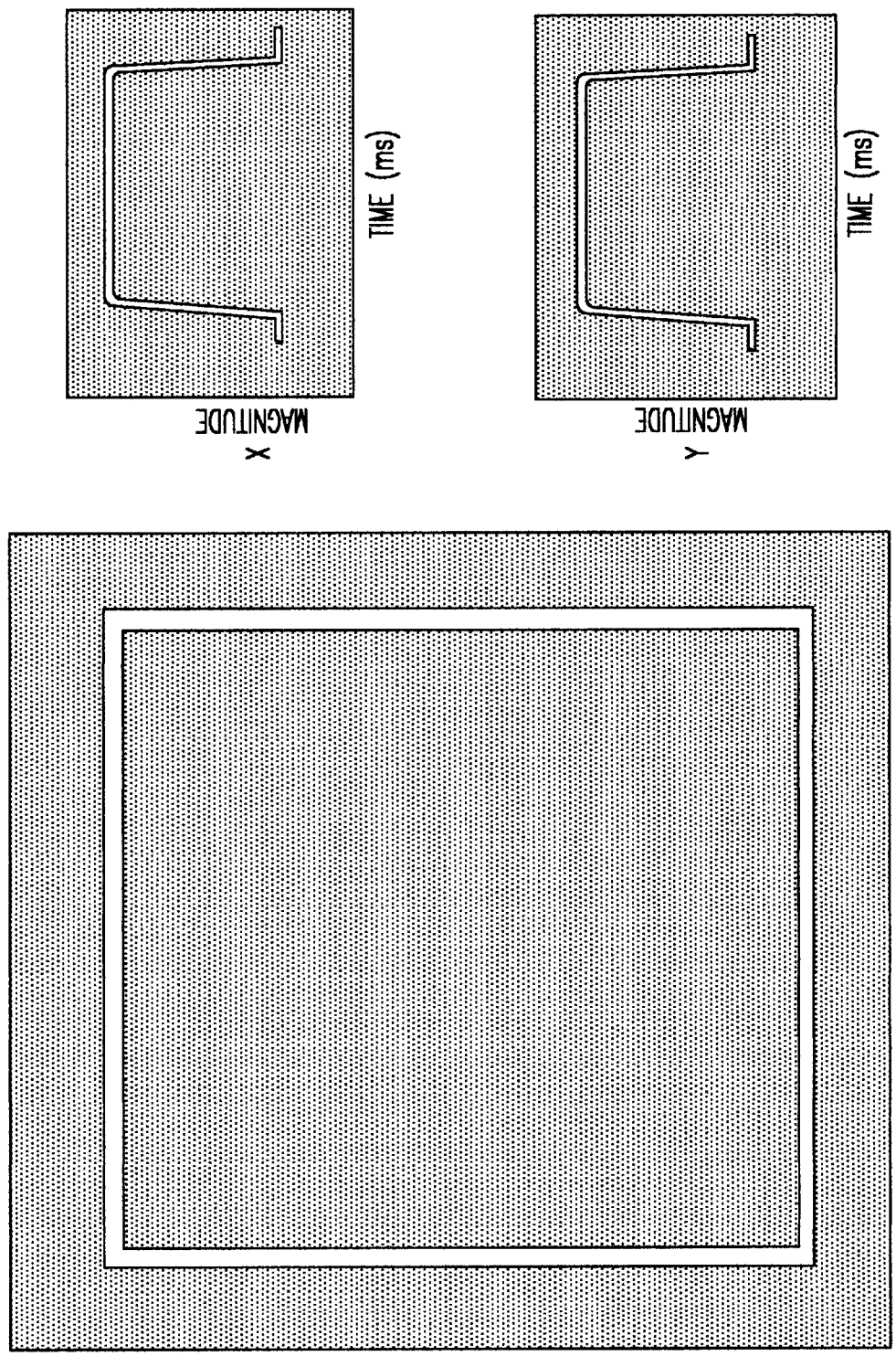
FIG. 2 illustrates operation of a pin-hole aperture and scintillator detector in accordance with the invention.

The image projected on the target plane can be displayed in real time by rastering the image across the pin-hole. FIG. 2 illustrates an image of an unpatterned sub-field obtained from the output of detector 30 as an image is deflected across pin-hole 32 in the X and Y directions. In the same manner, patterned reticle sub-fields can be displayed on monitor 38, as shown. Relative position of the image and the pin-hole will be evident on the monitor.

In the following discussion, FIGS. 3–8 contain "before and after" depictions of respective steps in the alignment process in accordance with the invention. Arrows are used to depict the alteration of the initial image detected by detector 30 to an exemplary form at which the particular step of the process can be considered complete.

Figure 3:
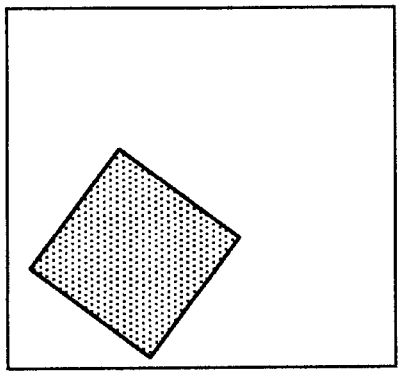
FIGS. 3, 4, 5, 6, 7 and 8 illustrate individual steps of the alignment process in accordance with the invention.
Figure 3:
Figure 3:
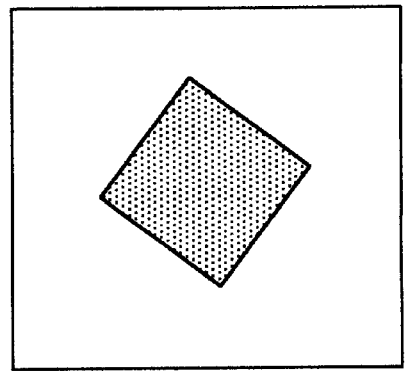

Referring now to FIG. 3, the process of alignment in accordance with the invention is performed by removing the reticle 14 to allow an image of shaping aperture 12 to be imaged at the target plane with an intermediate image at the reticle plane. Since, as is assumed for purposes of this discussion, no adjustment has been previously performed, the image may initially be decentered. The target plane translation stage (sometimes referred to hereinafter as the wafer stage) carrying the detector 30 is then moved to center the pinhole beneath the image and thus center the display on monitor 38. Orientation of the shaping aperture image is not important at this stage and this step may be considered complete when the image appears centered.

Figure 4:
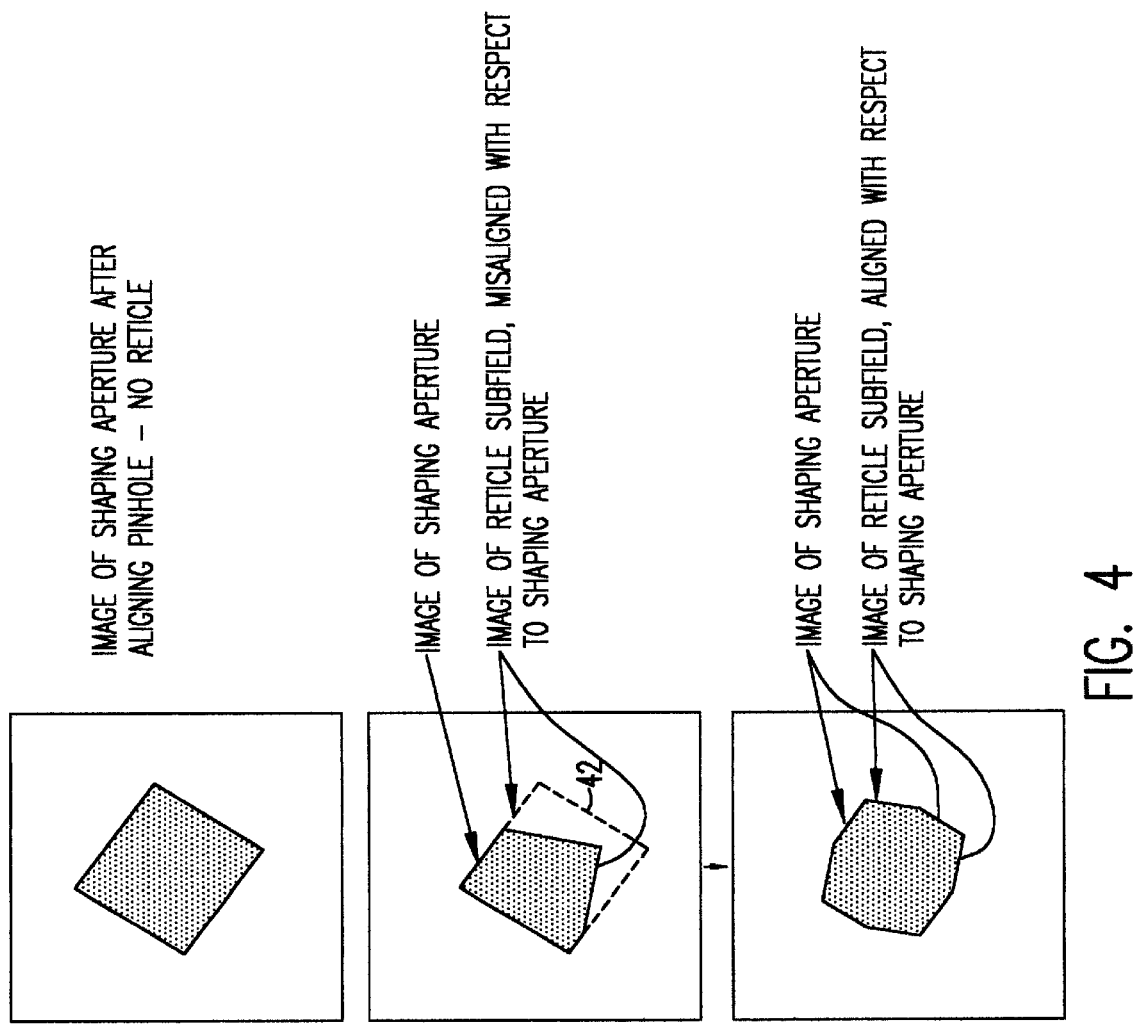

Next, referring to FIG. 4, a reticle is placed at the reticle stage. It is preferred to use a reticle including an open sub-field or at least where patterning of the sub-field allows detection of the edges of the sub-field. It is also preferred that the shaping aperture be imaged to the reticle plane and approximately the size of the sub-field. Ordinarily, this will result in edges of the sub-field of the reticle intercepting a portion of the shaping aperture image since the reticle aperture has not yet been aligned to the shaping aperture. The reticle is then centered over the shaping aperture image by moving the reticle with the reticle translation stage. Correct centering will be very evident from the symmetry of the resulting compound image at the detector. If, as is preferred, the reticle opening is sized to correspond to the shaping aperture image at the reticle plane (e.g. about 1 mm), the alternating sides of the image, respectively produced by the shaping aperture and the reticle opening will be approximately the same length (differing only by an amount commensurate with any difference in size between the reticle sub-field and the shaping aperture image) when the reticle is properly centered.

Figure 5:
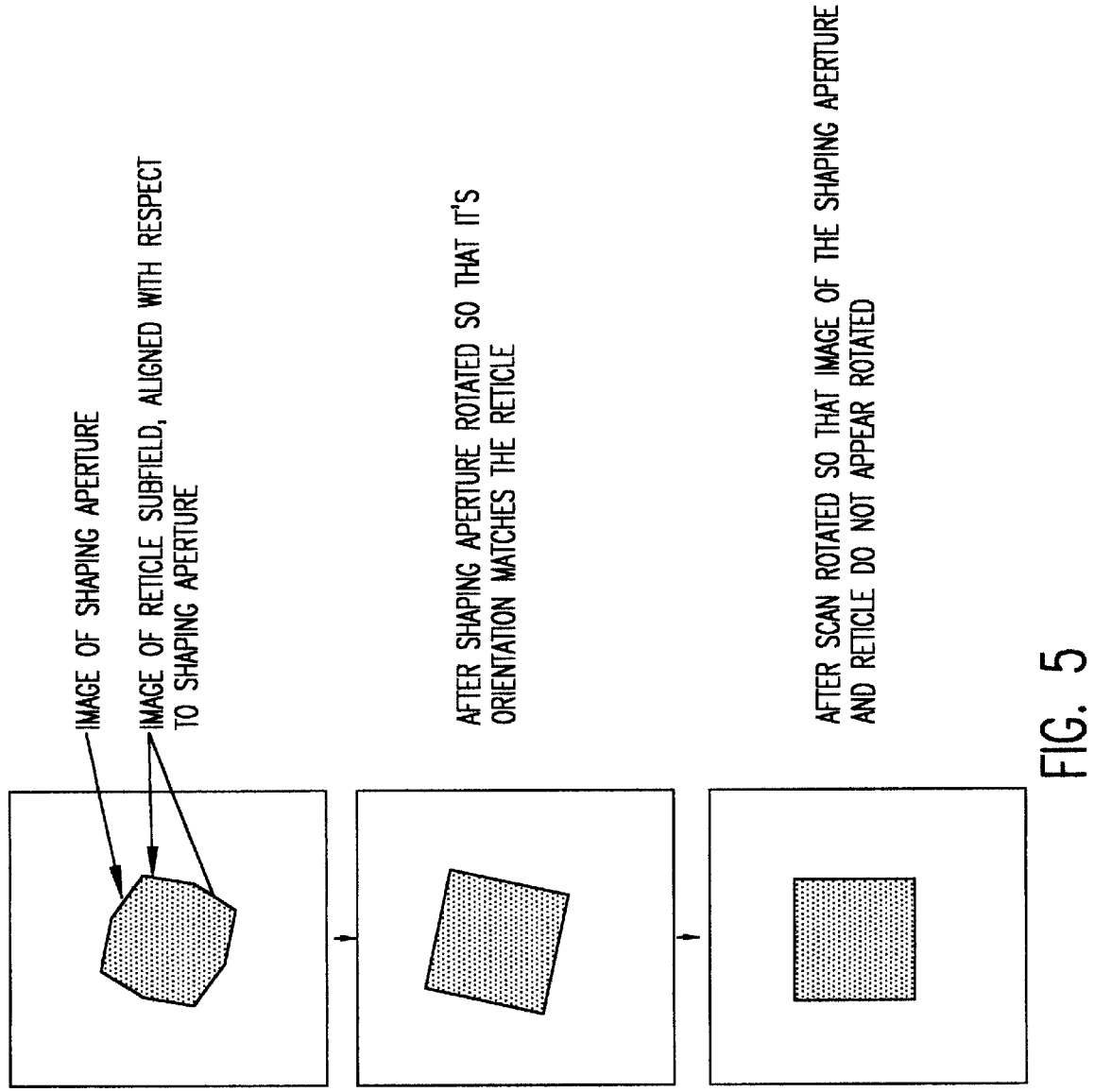

Then, as shown in FIG. 5, the shaping aperture is rotated so that its image lines up with the reticle opening. Correct alignment will be abundantly evident when edges produced by the shaping aperture and the reticle opening substantially overlie each other and the edges produced by each cannot be distinguished. Then, deflector 22 is either mechanically or electrically rotated such that the image of the shaping aperture overlaid by the reticle aperture does not appear rotated. This rotation correction need only be approximate.

At this point, the images of the shaping aperture and the reticle sub-field are aligned and the yoke deflection is oriented such that the compound image is not rotated. However, it is likely that this image is rotated with respect to the target plane. Adjustment of image rotation with respect to wafer stage travel will now be discussed.

Figure 6:
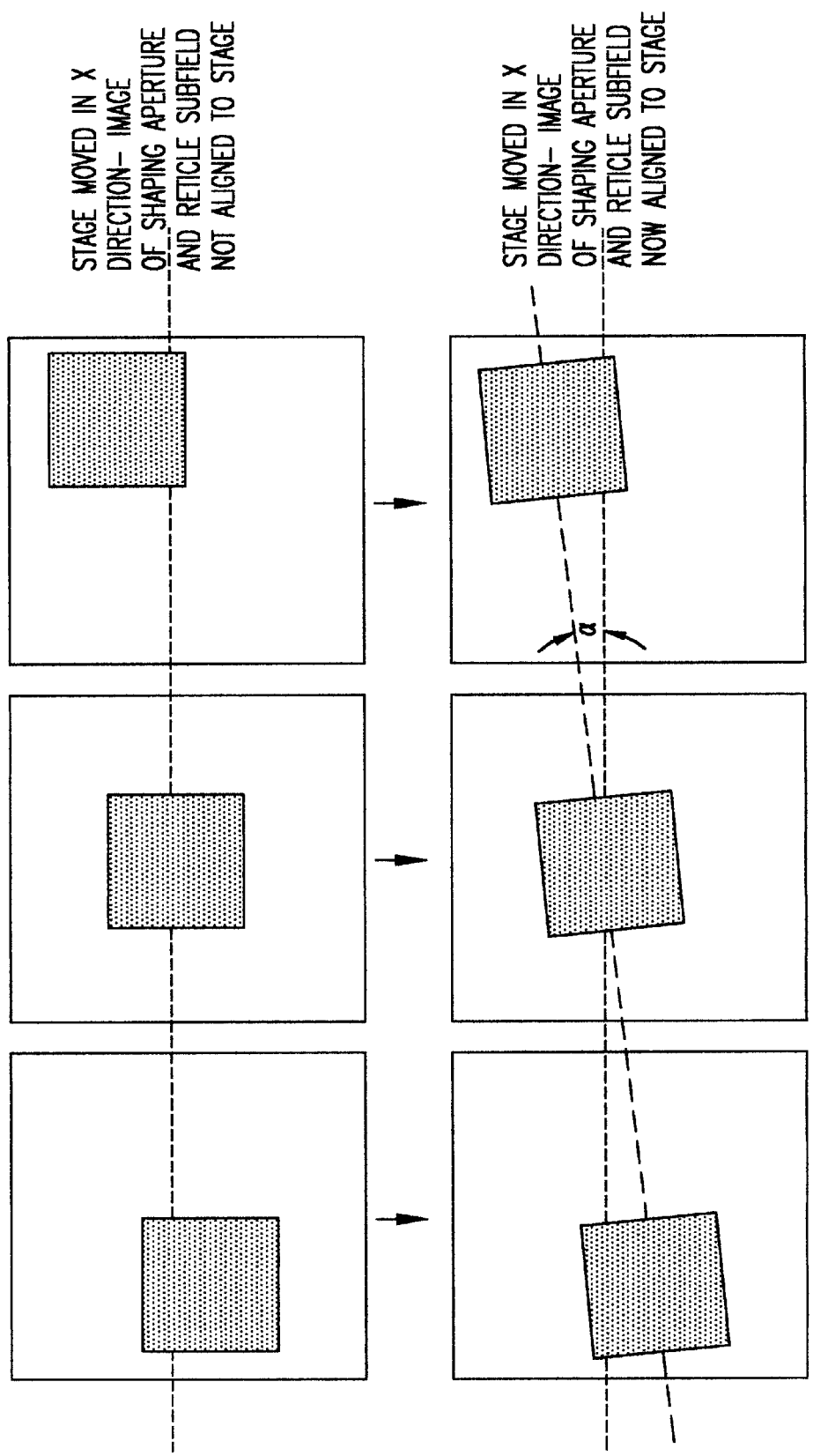

Referring now to FIG. 6, the translation stage at the target plane (which also carries detector 30) is moved along either coordinate axis; the X axis being preferred and assumed for purposes of this discussion. If the image appears to move off-axis (e.g. shift in a direction orthogonal to translation stage movement, the image of the sub-field and the shaping aperture are rotated relative to the translation stage.

It should be appreciated that the translation stage at the target plane (or wafer stage) is not easily rotated to achieve alignment and, in general, doing so is not preferred even if such rotation were convenient. The latitude for and ease of correction with optics exceeds that of mechanical rotation of the wafer stage. Further, the mechanical center of rotation for the wafer stage is not readily fixed although it would be indicated at this point in the process by the location of pin-hole aperture 32. Moreover, mechanical rotation of the wafer stage may require interruption of the alignment process by requiring the vacuum in the electron beam column to be eliminated to allow access and reestablished after adjustment, perhaps numerous times.

If such misalignment is detected after adjusting focus/dynamic corrections, the image of the reticle sub-field/shaping aperture is rotated by adjustment of lens system 20 (a combination of three focus coils that can be used to independently control focus, rotation and magnification of the sub-field image) such that the orientation of the reticle sub-field/shaping aperture image (hereinafter sometimes referred to as a composite or compound image) coincides with the angle, $\alpha$, at which the image appears to move as the stage is moved. This condition is clearly visible on the monitor 38, particularly if a square or rectangular image is produced since two sides of the image will be parallel to the apparent image motion on the monitor when correct alignment/adjustment is achieved. This process approximately compensates for rotation of the beam below the reticle stage and, while the image appears rotated on monitor 38, that rotation is due only to the rotation of the beam by the lens system below the reticle and not misalignment of the shaping aperture and/or reticle sub-field.

Figure 7:
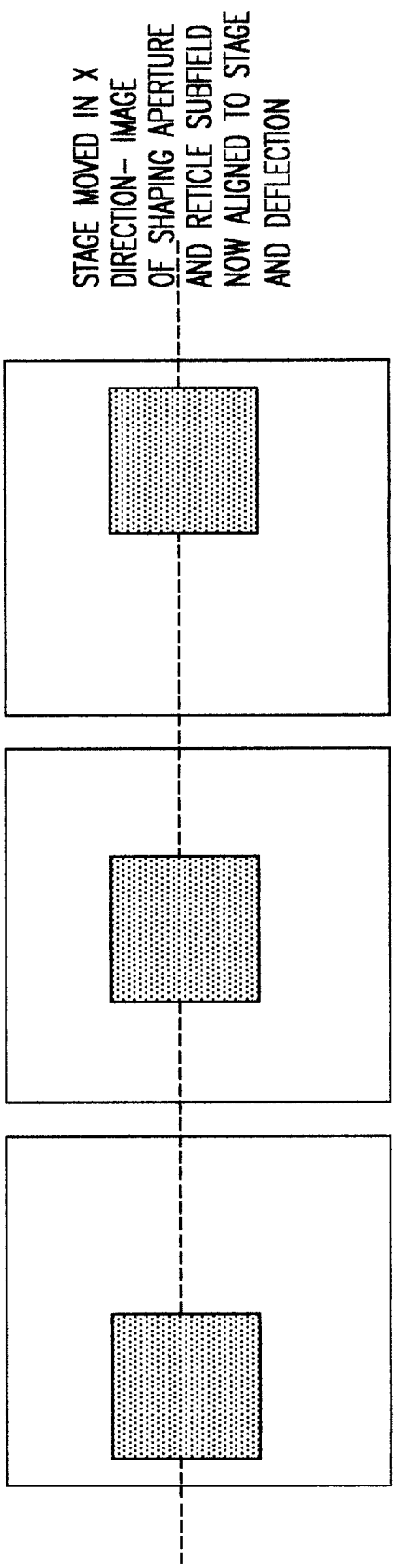

It was noted above that the initial rotation of the compound image was correctable by rotation of the deflection coils (or plates if electrostatic deflection is employed). The deflector rotation is now again adjusted to achieve correct orientation of the image on the monitor 38, as illustrated in FIG. 7. The refinement of adjustment of the lens system can be performed without affecting adjustment of the alignment of previously aligned elements.

Figure 8:
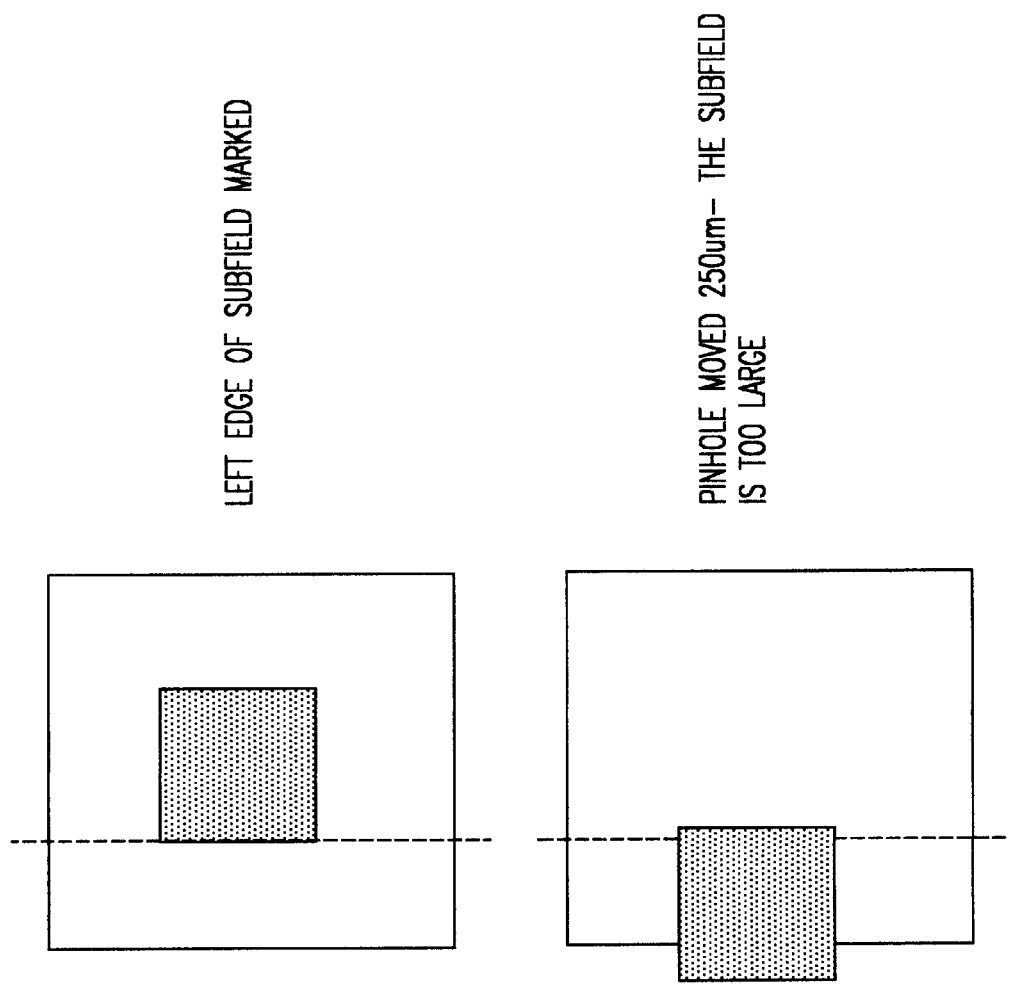

The final procedure in the alignment process in accordance with the invention is to adjust the size of the reticle sub-field. This is performed by moving the target plane translation stage by precisely the desired dimensions of a sub-field image (generally 250 microns, demagnified from 1 mm at the reticle). If the location of an edge of the image opposite to the direction of shift overlaps the location of an edge of the image prior to the shift, the image is too large, as illustrated in FIG. 8. Conversely, if the image is shifted beyond the boundary of the unshifted image, the image is too small. Correction is made by adjusting the three focus coils in lens system 20 in the proper ratio to effect magnification without causing image rotation or focus change. To the degree that changing the image magnification effects image rotation, it may be necessary to iterate through the steps shown in FIGS. 6–8.

Figure 9:
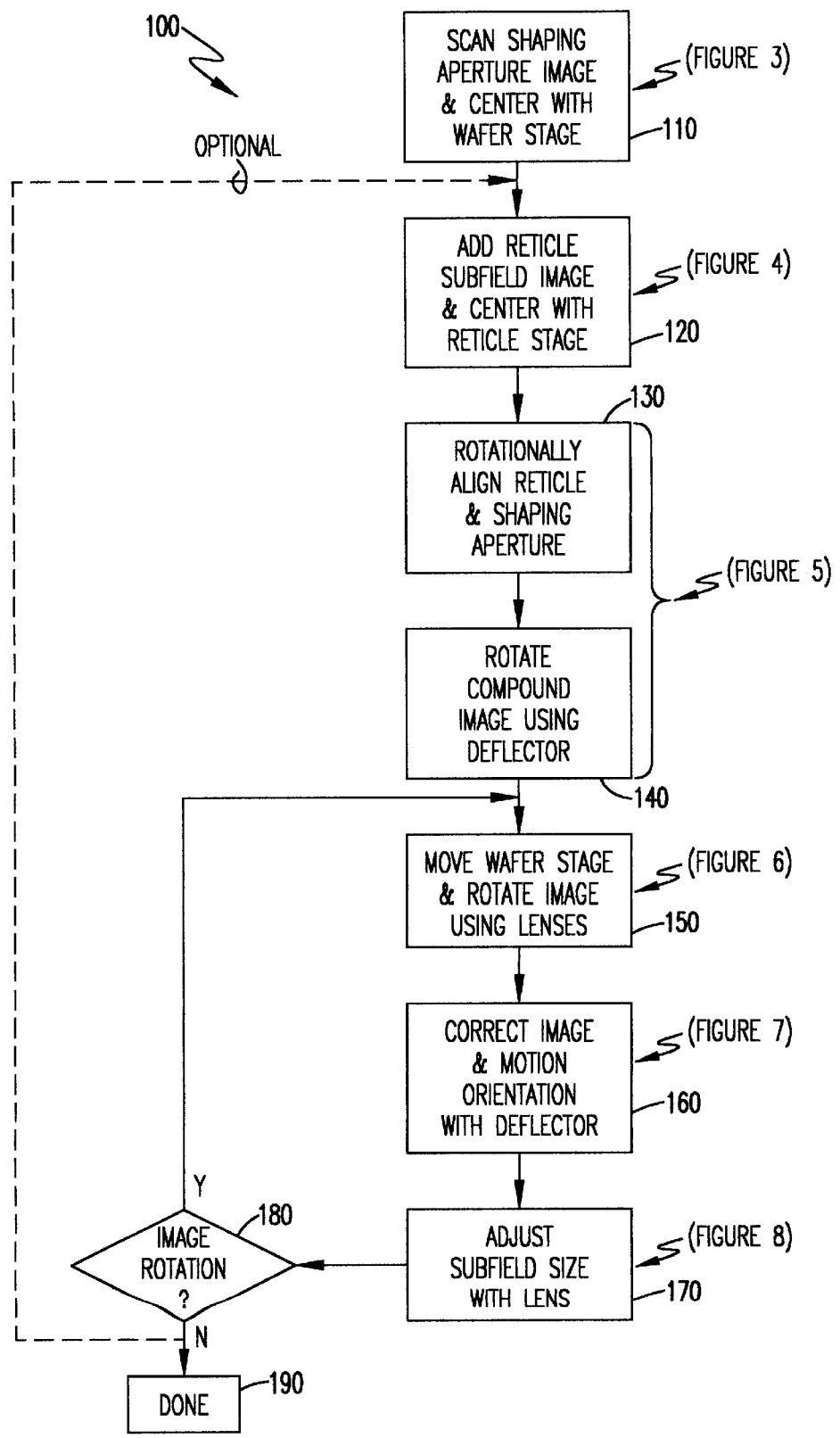
FIG. 9 is a flow chart illustrating an alignment process in accordance with the invention.

To recapitulate the methodology 100 of the invention, reference is now made to FIG. 9. Initially, the detector is centered on the image of the shaping aperture using the wafer stage as depicted at 110. Second, a reticle sub-field image is centered on the shaping aperture image using the reticle stage (120). The reticle sub-field image and the shaping aperture image are then rotationally aligned (130) and the compound image is rotated using deflectors 22 (140). The wafer stage is then moved in a coordinate direction and the compound image is rotated (150) to coincide with the apparent angle of motion relative to image motion orthogonal to wafer stage movement using lenses 20 and then the image orientation and image motion direction are corrected together (160) to coincide with wafer stage translation by rotation of the deflector 22.

Finally, the sub-field size is adjusted using lens system 20, as illustrated at 170 and any resulting rotation of the image is detected at step 180. If any image rotation is detected, the process loops back to 150 and rotation corrected by rotational adjustment of the lenses 20 and deflectors 22. Generally a single loop is sufficient for this purpose. If any other residual misalignment is then detected, the process can optionally be repeated starting at 120 to further refine the tool alignment. As indicated above, this iteration over a larger portion of the process will seldom be justified and, in accordance with the invention, any iterative adjustment may be confined to a very small and relatively simple portion of the process and the number of iterations closely limited.

In view of the foregoing, it is seen that the invention provides a straightforward and systematic methodology for aligning an electron beam projection lithography tool to achieve close positional operating tolerances in a minimal number of relatively simple and easily monitored processes. Iterative adjustment is closely limited and interactions between electron-optical elements of the tool are accounted for and effectively separated.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method for aligning elements of an electron beam projection lithography tool, said method including steps of
   centering and rotationally aligning an image of a shaping aperture with an image of a reticle sub-field to form a compound image,
   aligning orientation of said compound image with movement of a wafer stage of said electron beam projection lithography tool by lens adjustment, and
   correcting orientation and motion of said compound image relative to said movement of said wafer stage by rotational adjustment of a deflector.

2. A method as recited in claim 1, including further steps of
   adjusting size of said image of said reticle sub-field,
   detecting rotation of said compound image resulting from said step of adjusting size, and
   repeating said correcting step when rotation of said compound image resulting from said step of adjusting size is detected.

3. A method as recited in claim 2, including the further steps of
   detecting said compound image, and
   displaying said compound image.

4. A method as recited in claim 3, including the further step of rastering said compound image over a detector.

5. A method as recited in claim 2, including a further steps of
   displaying an image of a pattern projected on a target plane of said electron beam projection lithography tool forming a displayed image, and
   performing at least one of said centering and rotationally aligning step, said aligning step, said adjusting size step, said detecting rotation step and said correcting step in real time in accordance with said displayed image.

6. A method as recited in claim 1, including the further steps of
   detecting said compound image, and
   displaying said compound image.

7. A method as recited in claim 6, including the further step of rastering said compound image over a detector.

8. A method as recited in claim 1, wherein said step of centering and aligning includes the further steps of
   centering a detector on said image of said shaping aperture,
   centering said image of a reticle sub-field on said image of said shaping aperture, and
   rotationally aligning said image of a reticle sub-field with said image of said shaping aperture.

9. A method as recited in claim 1, wherein said rotational adjustment of said deflector is performed mechanically.

10. A method as recited in claim 1, wherein said rotational adjustment of said deflector is performed electrically.

11. A method as recited in claim 1, including a further steps of
   displaying an image of a pattern projected on a target plane of said electron beam projection lithography tool forming a displayed image, and
   performing at least one of said centering and rotationally aligning step, said aligning step and said correcting step in real time in accordance with said displayed image.

* * * * *